United States Patent [19]

Rozmus

[11] Patent Number: 4,997,379

[45] Date of Patent: Mar. 5, 1991

[54] ELECTRICAL CONTACTS

[76] Inventor: John J. Rozmus, 1330 Derwydd La., Berwyn, Pa. 19312

[21] Appl. No.: 453,838

[22] Filed: Dec. 20, 1989

Related U.S. Application Data

[63] Continuation of Ser. No. 254,105, Oct. 6, 1988, abandoned, which is a continuation of Ser. No. 103,348, Oct. 1, 1987, abandoned.

[51] Int. Cl.$^5$ ............................................. H01R 13/41
[52] U.S. Cl. ........................................ 439/84; 439/751
[58] Field of Search ..................................... 439/81-84, 439/751

[56] References Cited

U.S. PATENT DOCUMENTS

| | | | |
|---|---|---|---|
| 4,655,537 | 4/1987 | Andrews | 439/751 |
| 4,723,925 | 2/1988 | Orr et al. | 439/83 X |
| 4,735,575 | 4/1988 | Shaffer | 439/751 X |
| 4,752,250 | 6/1988 | Seidler | 439/751 |

Primary Examiner—Eugene F. Desmond
Attorney, Agent, or Firm—Frederick J. Olsson

[57] ABSTRACT

An electrical contact to be inserted into an aperture in an electrical board, the contact has an elongated body with a pair of alignment surfaces each having the configuration of a segment of a cylinder whose diameter is substantially the same as the diameter of the aperture of the board into which the contact is to be inserted and whose axis is co-axial with said body axis. The alignment surfaces are circumferentially spaced apart. The alignment surfaces are used to engage the wall of said aperture to position and maintain the axis of the contact co-axial with the axis of said aperture. The contact also has retention means adjacent said alignment surfaces to engage the wall of the aperture to generate retaining forces.

3 Claims, 1 Drawing Sheet

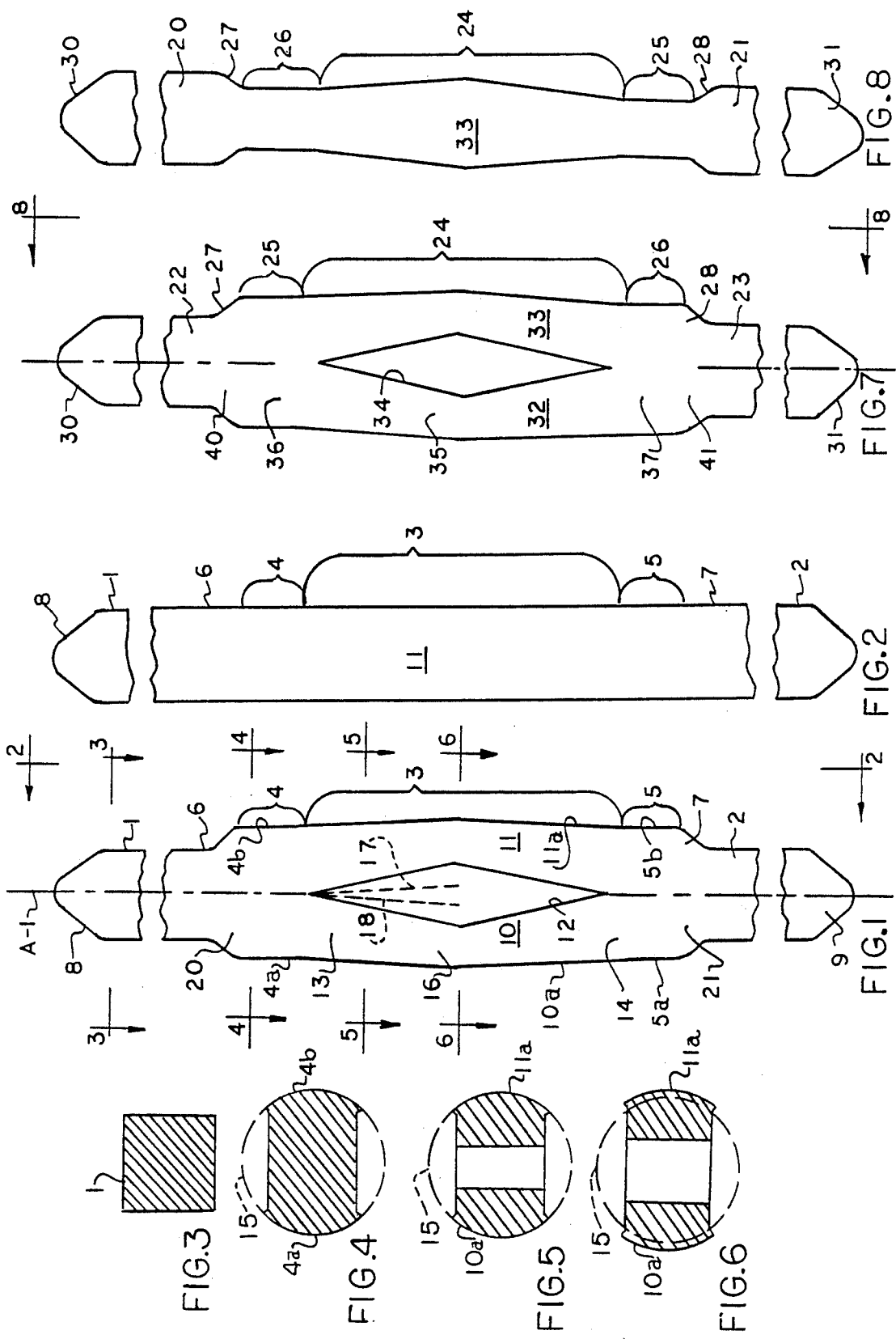

ELECTRICAL CONTACTS

This application is a continuation of Ser. No. 254,105 filed Oct. 6, 1988 (abandoned) which was a continuation of Ser. No. 103,348 filed Oct. 1, 1987 (abandoned).

This invention relates to electrical contacts particularly wire wrap pin contacts of the type having a connector tail, a wire wrap tail, and an intermediate retention section It has long been known to employ such contacts as a means to make electrical connections in equipment employing integrated circuits and printed circuit boards, for example, to make connections in communication and computer equipment. In most instances such contacts are mounted in plated holes in a printed circuit board to establish, via the plated holes, electrical connections to conductive paths on the board. In some instances the contacts are mounted in nonplated holes and serve as conductors between electrical elements on opposite sides of the board.

Conventionally, such contacts are mass produced by being stamped out in a progressive die. The contacts are set up for use in equipment of the kind mentioned by machine-mounting a large number of contacts in an insertion carrier or fixture, the connector tail of each contact being inserted in a socket in the carrier with the retention section an wire wrap tail extending outwardly from one face of the carrier. Subsequently, the carrier is positioned over the surface of a printed circuit board with respective wire wrap tails aligned with holes in the board. The carrier and board are relatively moved toward one another so that in each contact the wire wrap tail and retention section move into the aperture until the wire wrap tail extends outwardly from the opposite face of the board and the retention section engages with the side of the aperture. The wire wrap tails of the contacts are subsequently wrapped with wire.

Depending upon the application, the above mentioned carrier or fixture may be permanently mounted on the board with the connector tails of the contacts making internal electrical connections or the carrier or fixture may, after contact insertion, be removed leaving the connector tails free for subsequent connection to electrical elements.

A wire wrap operation is characterized by that it proceeds at very high speed and the position of the means which does the actual wrapping of the wire wrap tail is determined by a computer program which positions the wrapping means as a function of the location of the axis of each aperture and not by sensing the actual location of the wire wrap tail and accordingly adjusting position. It is essential therefore, that the axis of the wire wrap tail of each contact not be bent; i.e. that it be co-axial with the axis of the aperture.

If the wire wrap tail of the contact is bent, the wire wrap operation will product defective boards by failing to wrap the bent tail or improperly wrapping same or the operation will automatically terminate until the wire wrap tail is repositioned to be co-axial. Assuming that a contact is produced with a straight axis, the affect of the behavior of the retention section during the insertion of the contact in a board aperture is the source of the bent or non-coaxial condition.

Retention sections in contacts of the kind in question are of two types One type contemplates a solid configuration which has a minimal, if any, yield upon insertion. The other type contemplates a configuration deliberately designed to substantially yield during insertion.

For the most part, the solid type retention section behaves during the insertion operation in a way which elininates bending of the wire wrap tail or if it bends at all, the amount is insignificant and creates no problem in the wire wrap operation. From that standpoint, contacts with such retention sections are desirable. However, such contacts have several disadvantages.

One of the disadvantages of the solid or non-yielding type is that the amount of pressure to force a large number of contacts into the board apertures is so great that there is a severe limitation in the number of such contacts which can simultaneously be inserted. Another disadvantage is that the engagement with the aperture wall causes damage to same. A further disadvantage is that when the solid retention section design is tailored to minimize insert pressure and wall damage, the contact is prone to fall out with expansion and contraction of the circuit board aperture which will occur under operation (heat) and non-operation (cool)conditions of the equipment.

In view of the disadvantage of the solid retention section described above, the great majority of wire wrap pin type contacts employed today have retention sections designed for a resilient or yielding characteristic. Conventionally, these retention sections take the form of two or more flexible or resilient arms, two or more flexible or resilient fins, or a single, folded-over section shaped to engage the aperture wall at several circumferential points.

The prime disadvantage of the resilient or yielding retention section is that it is virtually impossible to stamp out a retention section having a symmetry of cross-section and distribution of material and shape so that corresponding parts will uniformly yield as the contact is inserted into the aperture. For example, in the type employing two resilient arms, it is impossible to make two arms which are physically identical in all respects. Therefore, the arms will have different yield characteristics as the insertion takes place and this difference causes the wire wrap tails to bend and the axis of the wire wrap tail and the axis of the aperture are not co-axial This creates a problem in the wire wrap operation since the machine is programmed to wrap a tail which is co-axial with the axis of the aperture of the board.

Therefore, the boards have to be tested prior to the wire wrap operation to insure that the axis of each tail is properly aligned. Defective boards must be rejected or repaired. Both of these alternatives are costly.

Thus, the principal objective of the invention is to provide a pin type contact having a resilient retention section together with alignment means which functions to insure that neither the wire wrap tail nor the connector tail will bend and thus providing for an inserted contact whose axis is co-axial with the axis of the aperture.

In cases where the insertion fixture or carrier is of the permanent type, only a single alignment means is provided. Where the insertion fixture is to be removed from the contact, the contact is provided with two alignment means one which avoids bending of the wire wrap tail and the other avoids bending of the connector tail.

In one aspect the invention contemplates a contact having a central retention section of the resilient type, and adjacent one or both ends of the retention section an alignment section which preferably takes the form of oppositely disposed segments of a cylinder whose diameter is substantially the same as the diameter of the aperture in which the contact is to be inserted and whose center lies in the axis of the contact.

Further, the invention contemplates that such contacts be formed either from square wire stock preferably using a progressive die for high speed production or form strip stock also utilizing a progressive die.

In the case of a contact made from square wire, the invention contemplates the coining of the wire in a special way to achieve the contact shape desired. The contact of the invention made from square wire not only has the non-bending feature mentioned heretofore, but has the additionally important feature of having a manufacturing cost which is about one half that of forming the contact from strip stock.

In making the insertion of a contact of the invention, the wire wrap tail enters and passes through the aperture followed by an alignment section. As the alignment section is passing through the aperture it is immediately followed by the resilient retention section which engages the aperture wall and yields. Even when the yielding is not uniform so that the forces seek to bend the wire wrap tail, the latter forces are overcome by the alignment section and the axis of the wire wrap tail remains coaxial with the aperture axis. With continued penetration of the contact, the other alignment section engages the aperture wall. The other alignment section is effective to maintain the axis of the connector tail co-axial with the aperture axis in those instances where the fixture or carrier is removed.

The invention will be described below in connection with the following drawings wherein:

FIG. 1 an elevational view of a contact of the invention formed from strip in a progressive die;

FIG. 2 is a side view looking along the lines 2—2 of FIG. 1;

FIGS. 3-6 are cross sectional views taken respectively along the lines 3—3, 4—4, 5—5, and 6—6 in FIG. 1;

FIG. 7, is an elevational view of a contact of the invention formed from square wire stock in a progressive die; and FIG. 8 is a side view looking along the lines 8—8 of FIG. 7.

Conventionally, engineering specifications for printed circuit boards and wire wrap pin contacts for use in commerical and industrial equipment specify boards having a thickness of 0.125" with apertures each of a diameter between 0.038" and 0.042" and also specify the contacts having connector and wire wrap tails 0.025" square. The unusual length of such contacts is between 0.500" and 1.250".

For the most part, such contacts are made from resilient copper alloy such as phosphorus bronze. The contacts are formed in a progressive die by employing conventional techniques. No details of the construction and operation of a progressive die are given herein. Typical progressive dies stamping out contacts from strip stock are shown in my U.S. Pat. Nos. 3,990,864 and 4,641,910.

Prior to my invention, contacts of the kind in question were conventionally fabricated from strip stock. In contrast, my invention provides greatly improved contacts which can be fabricated both from strip stock and most importantly from square wire stock. The structure of my new contacts will now be described.

For disclosure purposes, the contacts of the invention will be describe with connector and wire wrap tails 0.025" square and with a retention section for use in circuit boards having apertures each with a nominal diameter of 0.040". The foregoing dimensions and other dimensions noted hereinafter are employed for descriptive purposes and not by way of limitation. The term "square" is inclusive of the term "rectangular".

I will first describe the contacts of the invention as made in a progressive die from 0.025" copper alloy strip stock.

Referring to FIGS. 1 and 2 the contact includes a connector tail 1, a wire wrap tail 2, a retention section 3, alignment sections 4 and 5, and tapered transition sections 6 and 7, all of which are disposed along the axis A-1 of the contact. The contact terminates in the truncated ends 8 and 9.

The connector tail 1, and the wire wrap tail 2 are each cut from the strip to have a 0.025" thickness, and, thus have a square configuration as will be observed from an inspection of FIG. 3.

The retention section 3 includes a pair of outwardly bowed arms 10 and 11 separated by an open center 12. The arms extend axially between the points indicated at 13 and 14 and may be fabricated as explained in my U.S. Pat. No. 4,641,910. The cross sectional shapes of the arms are illustrated in FIGS. 5 and 6 where the circuit board aperture is indicated by dotted line 15. It will be observed that the outer edges or operating surfaces 10a and 11a have a semi-circular shape. The small bulged out areas of the extreme ends of the surfaces are created by metal flow when the surfaces are formed.

When the arms are inserted in a printed circuit board aperture, the surfaces 10a and 11a engage the wall and the arms flex inwardly toward the axis A and develop retaining forces. The respective shapes of the surfaces 10i a and 11a are coordinated with the diameter of the board aperture so that when the surfaces are engaged with the aperture wall, they will substantially coincide with the circumference of the aperture throughout their respective axial lengths.

In the embodiment shown, the lateral dimension across the contact at the center point 16 is 0.043" and the lateral dimension across the contact at the points 13 and 14 is 0.038". The distance between the points 13 and 14 is 0.085". Thus, there is a small taper of the surfaces 10a and 11a from the center point 16 to the points 13 and 14. It will be evident from the above and from an inspection of FIGS. 4-6 that the surfaces 10a and 11a, from the center point 16 out to the point 13 and from center point 16 out to the point 14, each have a configuration which is essentially that of a segment of a cylinder. When the arms are inserted in the aperture and flex inwardly, the configuration between points 13 and 14 has the same configuration; i.e. a segment of a cylinder.

Even though the surfaces 10a and 11a are tapered as above noted, these surfaces are formed so that at each point along the axis A from the center 15 to the ends 13 and 14 the radii are equal. This is accomplished by arranging the hugging operation tooling as noted in my U.S. Pat. No. 4,641,514 so that the radii of the surfaces 10a and 11aat the various axial positions are located respectively along the dotted lines 17 and 18. At each axial location, the radial distance between the dotted line 17 and the semi-circular surface 10a is one half the diameter of the board aperture. The same condition pertains between the dotted line 18 and the surface 11a. For the dimensions given, the dotted lines intersect at point 13 and are separated by a distance of 0.005" at point 16.

I will now describe the alignment sections 4 and 5.

As noted above, the outside dimension of the retention section 3 starting at the center 16 gradually decreases from 0.043" down to 0.038" at the points 13 and 14 which are starting points of the alignment sections 4 and 5.

The cross sectional shape of the alignment section 4 is indicated in FIG. 5. The alignment section 5 is identical.

The alignment sections 4 and 5 have semi-circular surfaces 4a and 4b and 5a and 5b. The radius of each surface lies in the axis A-1 and is 0.019" in length. The alignment section 4 extends axially between the point indicated at 13 and the point indicated at 20 and the alingment section 5 extends axially between the point indicated at 13 and the point indicated at 21. Both are 0.020" in length. It will seem that the surfaces 4a and 4b each have the form of a segment of a cylinder. Likewise, the surfaces 5a and 5b each have the form of a segment of a cylinder.

I will now describe the contact of the invention as made from 0.025" square wire stock.

Referring to FIGS. 7 and 8, the contact includes the connector tail 22, the wire wrap tail 23, the retention section 24, the alignment sections 25 and 26, and tapered transition sections 27 and 28 all of which are disposed along the axis A-2. The contact has truncated ends 30 and 31. The retention section 22 includes the outwardly bowed arms 32 and 33 separated by the open center 34.

The contacts as viewed in FIGS. 1 and 7 have the same exterior shape and have the same dimensions. Also, the contact of FIG. 7 has the same outside shape as shown in FIGS. 3 through 6.

As viewed in FIGS. 2 and 8, however, it will be observed that the exterior shapes are different. The contact in FIG. 2 is of uniform thickness due to the fact that it is fabricated from strip. The contact as illustrated in FIG. 9 has a definite contour due to the fact that the shape of FIG. 7 has been attained by coining the square wire as will be explained shortly.

Referring to FIG. 8, the contact at the center point indicated at 35 has a thickness dimension of 0.025" which is the same as the thickness of the square wire stock. The thickness dimension then gradually decreases to the points indicated at 36 and 37 and forms tapered sections on opposite side of center. Between points 36 and 40 (alignment section 23) and points 37 and 41 (alignment section 24), the thickness is a constant value of 0.017" and forms constant thickness sections. In the transition sections 25 and 26 the metal is tapered to accomodate change from large to smaller dimensions (FIG. 7) and from a small dimension to a larger dimension (FIG. 8). The points 36 and 37 represent the respective ends of cut-out 34 and the start of the alignment sections 23 and 24.

I will now briefly discuss the fabrication of the contacts of the invention as formed from strip and wire.

With respect to contacts formed from strip, the operation can be carried out so that the individual contacts are discharged from the die while joined to a portion of the strip which serves as a carrier, the latter being for use in delivering the contacts to a plating operation. After the plating operation the individual contacts are severed. For descriptive purposes herein, assume that the contacts are discharged while connected to a carrier.

First a strip of the appropriate width is fed into the die. An indexing hole is punched and this is followed by relief holes to form the vertical sides of the truncated end 8. This is followed by punches which remove metal to form the open outside contour of the arms 10 and 11, the alignment sections 4 and 5, and the transition sections 6 and 7. Afterward, punches remove metal from the connector tail 1 and wire wrap tail 2. This is followed by using hugger type tooling such as shown in my U.S. Pat. No. 4,641,514 to form the convex contours 10a, 11a, 4a, 4b, 5a, and 5b. Thereupon, other punches are employed to form the open center 12 and the ends are coined to complete the truncated ends 8 and 9. Additional coining operations may be performed for straightening or contouring purposes on the connector and/or wire wrap tail.

The carrier with the finished contact attached exits from the die to a plating station and after plating the plated contacts are severed from the carrier.

The process for forming the contacts from square wire will now be described.

First, a 0.025" wire is fed into the progressive die. The punches are employed to coin the wire so it assumes the contour as shown in FIG. 8.

The next operation involves the forming of the open section 34. This is done by the use of top and bottom splitting-wedge type punches the effect of which is to form an axial slot. The material on either side of the slot will constitute the material of the arms 32 and 33. Next, sizing punches are used to spread the slot and in effect to bow the arms outwardly. After that operation, an anvil is inserted in the opening and hugger type tooling employed to form the above described contours on the arms and alignment section. Finally, coining punches are employed to form the truncated ends 30 and 31.

For plating purposes, as the wire exits from the die, the lead contact is inserted into a socket in a transversly moving carrier. When the contact is in position it is served from the next adjacent contact. The carrier then conveys the contact to a plating operation.

I claim:

1. A pin-type electrical contact of wire substantially 0.025 inches square to be inserted into an aperture in a printed circuit board, the contact being an elongated body having a straight axis and the contact comprising:
   a first tail substantially 0.025 inches square and constituting one end of the body;
   a second tail substantially 0.025 inches square and constituting the opposite end of the body;
   a plurality of first alignment surfaces means formed on said body adjacent said first tail, the locus of the first alignment surface means having the configuration of a segment of a cylinder whose diameter is substantially 0.040 inches and whose axis is co-axial with said body axis, the respective first alignment surface means being circumferentially spaced apart;
   a plurality of second alignment surface means formed on said body adjacent said second tail and axially spaced from said first alignment surface means, the locus of the second alignment surface means having the configuration of a segment of a cylinder whose diameter is substantially 0.040 inches and whose axis is co-axial with said body axis and the respective second alignment surface means being circumferentially spaced apart;
   said alignment surface means being for use in engaging said aperture for positioning and maintaining the axis of the contact co-axial with the axis of said aperture; and dynamic retention means formed on said body intermediate said first and second alignment surfaces and extending in the same direction as said axis and dimensioned in one direction so as to engage said aperture and being flexible in said direction whereby the engagement with the aperture generates forces retaining the contact in the aperture, the dynamic retention means being dimensioned in a direction normal to said one direction less than 0.025 inches.

2. In combination, a pin-type electrical contact made from wire substantially 0.025 inches square and a printed circuit board having a cylindrically-shaped metal covered aperture substantially 0.040 inches in diameter, the electrical contact being an elongated body having a substantially straight axis, the contact comprising:

a first tail substantially 0.025 inches square constituting one end of the body;

a second tail substantially 0.025 inches square constituting the opposite end of the body;

a plurality of first alignment surfaces formed on said body adjacent said first tail, each alignment surface having the configuration of a segment of a cylinder whose diameter is substantially 0.040 inches and whose axis is co-axial with said body axis, the first alignment surfaces being circumferentially spaced apart;

a plurality of second alignment surfaces formed on said body adjacent said second tail and axially spaced from said first alignment surfaces, each of the second alignment surfaces having the configuration of a segment of a cylinder whose diameter is substantially 0.040 inches and whose axis is coaxial with said body axis and the second alignment surfaces being circumferentially spaced apart;

said alignment surfaces engaging said aperture to position and maintain the axis of the contact co-axial with the axis of said aperture; and retention means formed on said body intermediate said first and second alignment surfaces and extending in the same direction as said axis and dimensioned to engage said aperture and generate forces for retaining the contact in the aperture.

3. In combination a printed circuit board having a cylindrical shaped metal covered aperture and a pin-type electrical contact made from square wire the diagonal of which is less than the diameter of said aperture, and the electrical contact being an elongated body having a substantially straight axis, the contact comprising:

a first tail constituting one end of the body, the first tail being square and the diagonal of which is less than the diameter of said aperture;

a second tail constituting the opposite end of the body, the second tail being square and the diagonal of which is less than the diameter of said aperture;

a plurality of first alignment surfaces formed on said body adjacent said first tail each alignment surface having the configuration of a segment of a cylinder whose diameter is substantially the same as the diameter of said aperture and whose axis is co-axial with said body axis, the first alignment surfaces being circumferentially spaced apart;

a plurality of second alignment surfaces formed on said body adjacent said second tail and axially spaced from said first alignment surfaces, each of the second alignment surfaces having the configuration of a segment of a cylinder whose diameter is substantially the same as the diameter of said aperture and whose axis is co-axial with said body axis and the second alignment surfaces being circumferentially spaced apart;

said alignment surfaces engaging said aperture to position and maintain the axis of the contact co-axial with the axis of said aperture; and dynamic retention means formed on said body intermediate said first and second alignment surfaces and extending in the same direction as said axis and dimensioned to engage said aperture and generate forces for retaining the contact in the aperture.

* * * * *